United States Patent
Wu et al.

(10) Patent No.: US 10,339,986 B1
(45) Date of Patent: Jul. 2, 2019

(54) DATA LATCH CIRCUIT AND PULSE SIGNAL GENERATOR THEREOF

(71) Applicant: DigWise Technology Corporation, LTD, Hsinchu County (TW)

(72) Inventors: Jingjie Wu, Beijing (CN); Chih-Wen Yang, Hsinchu County (TW); Wen-Pin Hsieh, Hsinchu County (TW)

(73) Assignee: DigWise Technology Corporation, LTD, Hsinchu County (TW)

( * ) Notice: Subject to any disclaimer, the term of this patent is extended or adjusted under 35 U.S.C. 154(b) by 0 days.

(21) Appl. No.: 16/162,394

(22) Filed: Oct. 17, 2018

(30) Foreign Application Priority Data

Aug. 2, 2018 (TW) .............................. 107126898 A

(51) Int. Cl.
```
H03K 3/00      (2006.01)
G11C 7/10      (2006.01)
H03K 3/53      (2006.01)
H03K 3/027     (2006.01)
```

(52) U.S. Cl.
CPC ............ *G11C 7/1057* (2013.01); *G11C 7/106* (2013.01); *H03K 3/027* (2013.01); *H03K 3/53* (2013.01)

(58) Field of Classification Search
None
See application file for complete search history.

(56) References Cited

U.S. PATENT DOCUMENTS

| | | | |
|---|---|---|---|
| 5,041,738 A | 8/1991 | Walters, Jr. | |
| 5,742,192 A | 4/1998 | Banik | |
| 6,445,644 B2 * | 9/2002 | Sher | G11C 7/1072 365/194 |
| 2003/0151435 A1 * | 8/2003 | Ma | H03K 5/1565 327/175 |
| 2009/0108895 A1 * | 4/2009 | Saint-Laurent | H03K 3/037 327/176 |
| 2010/0259308 A1 | 10/2010 | Wang et al. | |

OTHER PUBLICATIONS

Dhong; Sang et al. "A 0.42V Vccmin ASIC-compatible pulse-latch solution as a replacement for a traditional master-slave flip-flop in a digital SOC," Proceedings of the IEEE 2014 Custom Integrated Circuits Conference, Sep. 15-17, 2014, pp. 1-4.
IIT Bombay, "Lecture-24 Methods for Reduction of Delays in Mutlistage Logic Net," Dec. 31, 2009, Available at: https://nptel.ac.in/courses/117101058/24.

* cited by examiner

*Primary Examiner* — Long Nguyen
(74) *Attorney, Agent, or Firm* — JCIPRNET

(57) ABSTRACT

A data latch circuit and a pulse signal generator thereof are provided. The pulse signal generator includes a first buffer, a second buffer, a pull-up switch and an output buffer. The first buffer generates a first buffering signal according to an input signal and a feedback signal. The second buffer generates a second buffering signal according to the input signal and the first buffering signal. The pull-up switch pulls up the second buffering signal according to the first buffering signal. The output buffer generates at least one output pulse signal according to the second buffering signal. The output buffer further outputs the at least one output pulse signal to the first buffer to be the feedback signal.

12 Claims, 13 Drawing Sheets

DATA LATCH CIRCUIT AND PULSE SIGNAL GENERATOR THEREOF

CROSS-REFERENCE TO RELATED APPLICATION

This application claims the priority benefit of Taiwan application serial no. 107126898, filed on Aug. 2, 2018. The entirety of the above-mentioned patent application is hereby incorporated by reference herein and made a part of this specification.

BACKGROUND OF THE INVENTION

1. Field of the Invention

The invention relates to a data latch circuit and a pulse signal generator thereof, and more particularly, relates to a data latch circuit and a pulse signal generator thereof that can operate in high speed.

2. Description of Related Art

In the prior art, a static flip-flop, a dynamic flip-flop and a pulse latch flip flop are usually used in design for the data latch circuit. In the prior art, despite the more robust effect on noise margin, the static flip-flop often needs a larger circuit area to be set, resulting in increased costs. On the other hand, the dynamic flip flop in the prior art is prone to data loss due to leakage current. Also, the dynamic flip flop in the prior art often suffers false operation caused by glitch on signals. As for the pulse latch flip flop, a high area density is required so it is difficult to design circuit layout.

SUMMARY OF THE INVENTION

The invention provides a data latch circuit and a pulse signal generator thereof that can operate in high speed, reduce required power consumption and save use of circuit area.

The pulse signal generator of the invention includes a first buffer, a second buffer, a pull-up switch and an output buffer. The first buffer receives an input signal and a feedback signal, and generates a first buffering signal according to the input signal and the feedback signal. The second buffer receives the input signal and the first buffering signal, and generates a second buffering signal according to the input signal and the first buffering signal. The pull-up switch is coupled to an output end of the second buffer, receives the first buffering signal, and pulls up the second buffering signal according to the first buffering signal. The output buffer is coupled to the first buffer and the second buffer, and generates at least one output buffer according to the second buffering signal. The output buffer further outputs the at least one output pulse signal to the first buffer to be the feedback signal.

In an embodiment of the invention, the first buffer includes a first transistor, a second transistor and a third transistor. A first end of the first transistor is coupled to a power voltage; a second end of the first transistor generates the first buffering signal; and a control end of the first transistor receives the input signal. A first end of the second transistor is coupled to the second end of the first transistor, and a control end of the second transistor receives the input signal. A first end of the third transistor is coupled to a second end of the second transistor; a control end of the third transistor receives the feedback signal; and a second end of the third transistor is coupled to a reference ground end.

In an embodiment of the invention, the second buffer includes a first transistor, a second transistor and a third transistor. A first end of the first transistor is coupled to a power voltage; a second end of the first transistor generates the second buffering signal; and a control end of the first transistor receives the input signal. A first end of the second transistor is coupled to the second end of the first transistor, and a control end of the second transistor receives the input signal. A first end of the third transistor is coupled to a second end of the second transistor; a control end of the third transistor receives the first buffering signal; and a second end of the third transistor is coupled to a reference ground end.

In an embodiment of the invention, the output buffer includes a first inverter. The first inverter receives the second buffering signal, and generates a first output pulse signal according to the second buffering signal.

In an embodiment of the invention, the output buffer further includes a second inverter. The second inverter receives the first output pulse signal, and generates a second output pulse signal according to the first output pulse signal.

In an embodiment of the invention, the pulse signal generator further includes a delay circuit. The delay circuit includes a plurality of inverters. The inverters are coupled in series on a path of the second buffer for receiving the first buffering signal and configured to provide a transmission delay for receiving the first buffering signal to the second buffer.

In an embodiment of the invention, a number of the inverters is an even number.

In an embodiment of the invention, the pulse signal generator further includes a delay circuit. The delay circuit includes a transmission gate. The transmission gate is coupled in series on a path of the second buffer for receiving the first buffering signal and configured to provide a transmission delay for receiving the first buffering signal to the second buffer.

The data latch circuit of the invention includes a plurality of latches and the pulse signal generator described above. The latches respectively receive a plurality of data signals, and latch the data signals according to at least one output pulse signal. The pulse signal generator is coupled to the latches, and configured to provide the at least one output pulse signal.

In an embodiment of the invention, each of the latches includes a first transistor, a second transistor, a third transistor, a fourth transistor and an inverter. The first transistor is coupled between a power voltage and a previous stage output end, and a control end of the first transistor receives each of the data signals. The second transistor is coupled between the power voltage and the previous stage output end, and a control end of the second transistor receives an inverted signal of the at least one output pulse signal. The third transistor is coupled between a reference ground end and the previous stage output end, and a control end of the third transistor receives each of the data signals. The fourth transistor is coupled between the reference ground end and the previous stage output end, and a control end of the fourth transistor receives the at least one output pulse signal. The inverter is coupled to the previous stage output end, and inverts a logic level on the previous stage output end to generate an output signal.

In an embodiment of the invention, the inverter includes a fifth transistor and a sixth transistor. A first end of the fifth transistor receives the power voltage; a second end of the fifth transistor generates the output signal; and a control end of the fifth transistor is coupled to the previous stage output end. A first end of the sixth transistor is coupled to the second end of the fifth transistor; a second end of the sixth transistor is coupled to the reference ground end; and a control end of the sixth transistor is coupled to the previous stage output end.

In an embodiment of the invention, each of the latches is a static latch, a scan D latch, a D latch with reset function, a D latch with setup function or a retention D latch.

Based on the above, the invention proposes the pulse signal generator composed of multiple buffers. By making the output pulse signal a feedback signal, the pulse signal generator is presented in a closed loop architecture capable of performing a detecting operation on a pulse width of the output pulse signal. Accordingly, the output pulse signal generated by the pulse signal generator can have a wide enough pulse width so the latch can effectively perform a latching operation on the data signal in the subsequent process. The pulse signal generator according to the embodiments of the invention can generate the output pulse signal of full swing and ensure that the latches operate correctly under different voltages, process parameters and temperatures.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
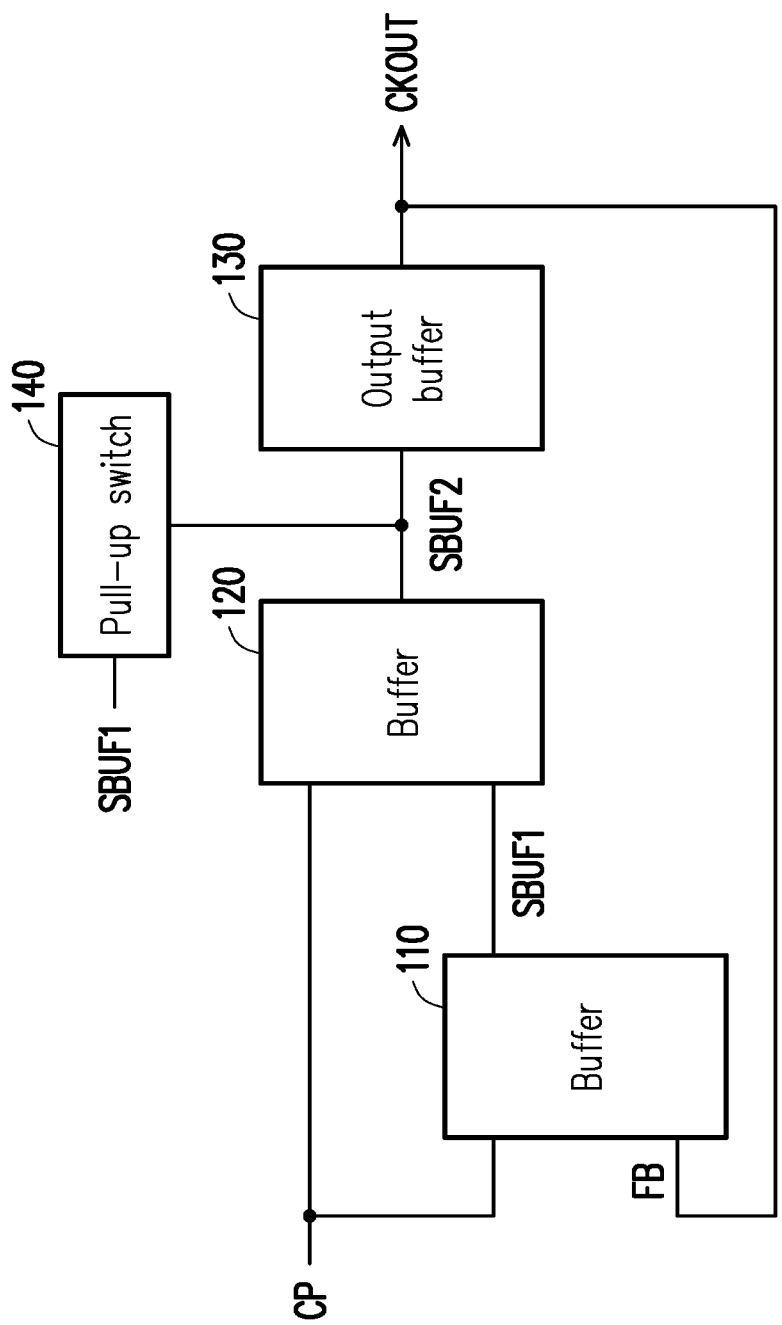
FIG. 1 is a schematic diagram illustrating a pulse signal generator in an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

With reference to FIG. 1, FIG. 1 is a schematic diagram illustrating a pulse signal generator in an embodiment of the invention. A pulse signal generator 100 includes buffers 110 and 120, an output buffer 130 and a pull-up switch 140. The buffer 110 receives an input signal CP and a feedback signal FB, and generates a buffering signal SBUF1 according to the input signal CP and the feedback signal FB. The buffer 120 is configured to receive the input signal CP and the buffering signal SBUF1, and generate a buffering signal SBUF2 according to the input signal CP and the buffering signal SBUF1. The pull-up switch 140 is coupled to an output end of the second buffer 120, receives the buffering signal SBUF1, and pulls up the buffering signal SBUF2 according to the buffering signal SBUF1. The output buffer 130 is coupled to the buffer 110 and the buffer 120. The output buffer 130 generates one or more output pulse signals CKOUT according to the buffering signal SBUF2. The output buffer 130 further outputs the output pulse signal CKOUT to the buffer 110 to be the feedback signal FB.

In this embodiment of the invention, the buffer 110 can generate the buffering signal SBUF1 that is inverted from the input signal CP. For instance, when the input signal CP received by the buffer 110 is at logic level 0, the buffer 110 can generate the buffering signal SBUF1 equal to logic level 1. When the input signal CP and the feedback signal FB received by the buffer 110 are both at logic level 1, the buffer 110 can generate the buffering signal SBUF1 equal to logic level 0. On the other hand, if the input signal CP is equal to logic level 1 and the feedback signal FB is equal to logic level 0, the buffering signal SBUF1 is maintained at its original state first and than pulled down to logic level 0 through a leakage path to a reference ground end.

As similar to the buffer 110, the buffer 120 can generate the buffering signal SBUF2 that is inverted from the input signal CP. For instance, when the input signal CP received by the buffer 120 is at logic level 0, the buffer 120 can generate the buffering signal SBUF2 equal to logic level 1. When the input signal CP and the buffering signal SBUF1 received by the buffer 120 are both at logic level 1, the buffer 120 can generate the buffering signal SBUF2 equal to logic level 0. On the other hand, if the input signal CP is equal to logic level 1 and the buffering signal SBUF1 is equal to logic level 0, the buffering signal SBUF2 is pulled up to logic level 1 according to a pull-up operation performed by the pull-up switch 140.

In this embodiment, the pull-up switch 140 determines whether to perform the pull-up operation on a voltage level of the buffering signal SBUF2 according to the buffering signal SBUF1. More specifically, when the buffering signal SBUF1 is at logic level 0, the pull-up switch 140 is activated to pull up the voltage level of the buffering signal SBUF2 to logic level 1. The output buffer 130 performs one or more inverting operations on a logic level of the buffering signal SBUF2 and thereby generate said one or more output pulse signals CKOUT. It should be noted that, a driving capability of the output pulse signal CKOUT can be improved through the output buffer 130.

In terms of the overall operation of the pulse signal generator 100, in an initial stage, the input signal CP is at logic level 0. At this time, the buffers 110 and 120 respectively and correspondingly generate to the buffering signal SBUF1 and the buffering signal SBUF2 at logic level 1. Further, based on the buffering signal SBUF1 at logic level 1, the pull-up switch 140 does not operate. The output buffer 130 performs one inverting operation on the buffering signal SBUF2 to generate the output pulse signal CKOUT at logic level 0 and provides the feedback signal FB equal to logic level 0 to the buffer 110.

After the initial stage, the input signal CP starts transitioning to logic level 1, and the buffer 120 generates the buffering signal SBUF2 at logic level 0 while a logic state of the buffering signal SBUF1 is not being effectively changed yet. Next, the output buffer 130 generates the output pulse signal CKOUT at logic level 1 by inverting the buffering signal SBUF2, and provides the feedback signal FB equal to logic level 1 to the buffer 110.

When the feedback signal FB is transitioned to logic level 1, the buffer 110 makes the generated buffering signal SBUF1 transitioning to logic level 0, and activates the pull-up switch 140 for the pull-up operation through the buffering signal SBUF1 transitioned to logic level 0. Accordingly, the buffer 120 can change the generated buffering signal SBUF2 to logic level 1. Correspondingly, the buffer 130 changes the generated output pulse signal CKOUT to logic level 0. In view of the above description, it can be known that, as corresponding to the operation of transitioning the input signal CP from logic level 0 to logic level 1, the output buffer 130 can generate the output pulse signal CKOUT with one pulse. It is worth mentioning that, a time delay required for transitioning the feedback signal FB to logic level 1 and driving the pull-up switch 140 to pull up the buffering signal SBUF2 to logic level 1 may serve as a reference for setting a width of the pulse generated on the output pulse signal CKOUT. Also, through the above operation mechanism, the pulse signal generator 100 in this embodiment of the invention can generate the output pulse signal CKOUT in high speed with a full swing pulse.

Figure 2A:
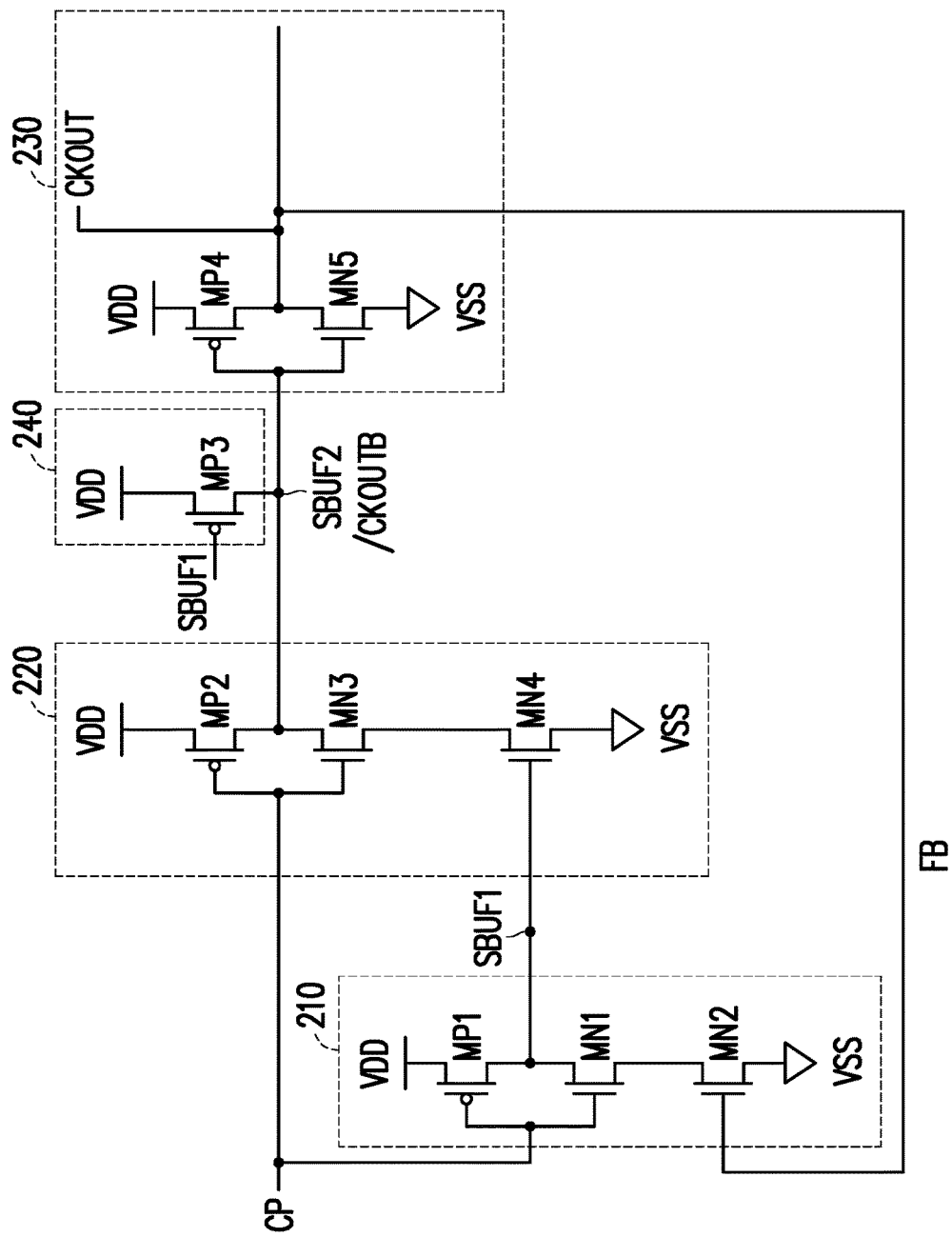
FIG. 2A and FIG. 2B are schematic circuit diagrams respectively illustrating the pulse signal generators in different embodiments of the invention.
Figure 2B:
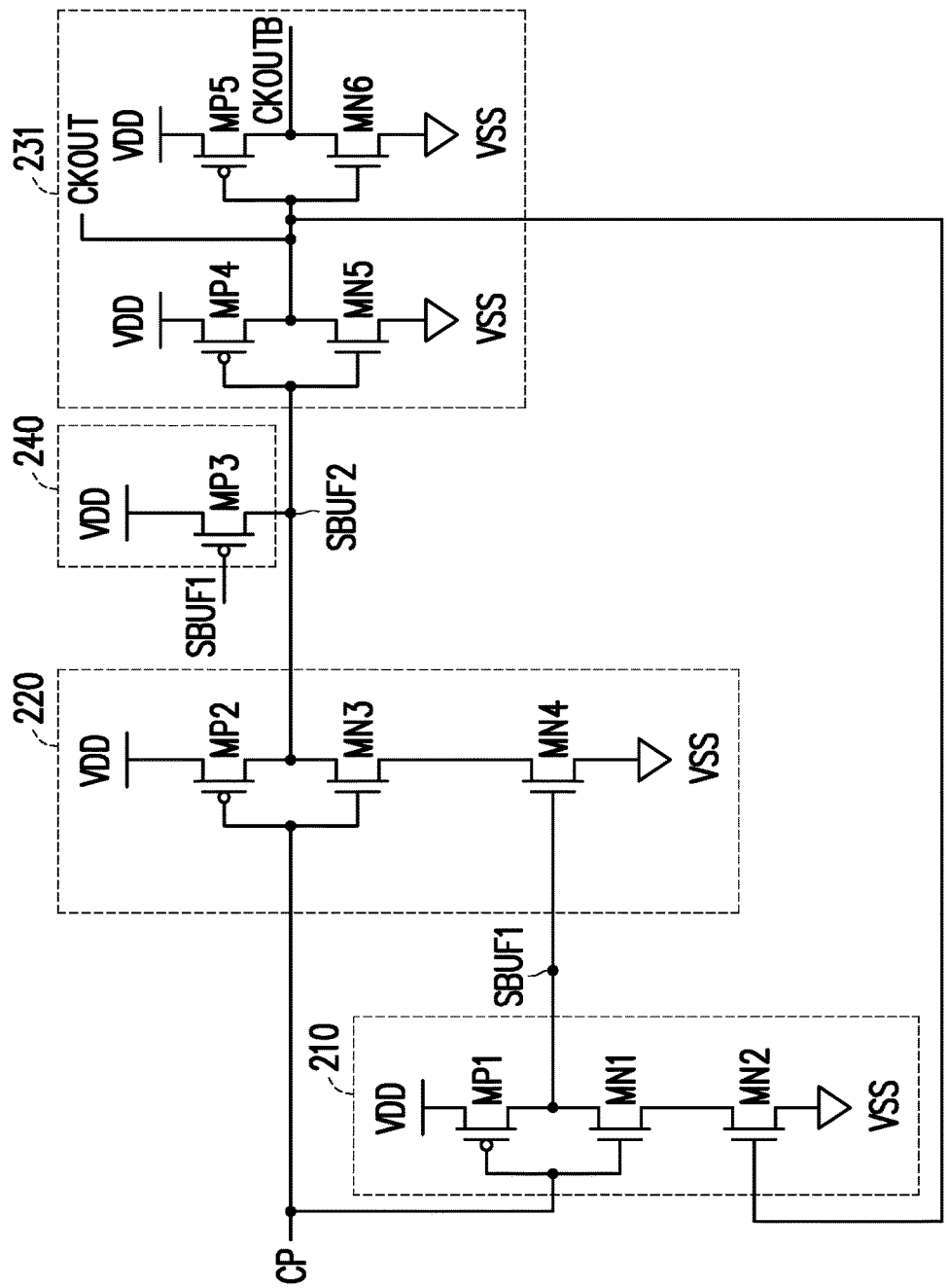

With reference to FIG. 2A and FIG. 2B, FIG. 2A and FIG. 2B are schematic circuit diagrams respectively illustrating the pulse signal generators in different embodiments of the invention. In FIG. 2A, a pulse signal generator 201 includes buffers 210 and 220, an output buffer 230 and a pull-up switch 240. The buffer 210 includes transistors MP1, MN1 and MN2. A first end of the transistor MP1 receives a power voltage VDD; a second end of the transistor MP1 generates the buffering signal SBUF1; and a control end of the transistor MP1 receives the input signal CP. A first end of the transistor MN1 is coupled to the second end of the transistor MP1, and a control end of the transistor MN1 receives the input signal CP. A first end of the transistor MN2 is coupled to a second end of the transistor MN1; a control end of the transistor MN2 receives the feedback signal FB; and a second end of the transistor MN2 is coupled to a reference ground end VSS.

Further, in this embodiment, the buffer 220 includes transistors MP2, MP3 and MN4. A first end of the transistor MP2 receives the power voltage VDD; a second end of the transistor MP2 generates the buffering signal SBUF2; and a control end of the transistor MP2 receives the input signal CP. In this embodiment, the buffering signal SBUF2 may serve as an inverted output pulse signal CKOUTB. A first end of the transistor MN3 is coupled to the second end of the transistor MP2, and a control end of the transistor MN3 receives the input signal CP. A first end of the transistor MN4 is coupled to a second end of the transistor MN3; a control end of the transistor MN4 receives the buffering signal SBUF1; and a second end of the transistor MN4 is coupled to the reference ground end VSS.

The pull-up switch 240 is composed of a transistor MP3. A first end of the transistor MP3 receives the power voltage VDD; a second end of the transistor MP3 is coupled to the second end of the transistor MP2; and a control end of the transistor MP3 receives the buffering signal SBUF1. The output buffer 230 includes an inverter composed of transistors MP4 and MN5. The transistors MP4 and MN5 are coupled in series between the power voltage VDD and the reference ground end VSS. Control ends of the transistors MP4 and MN5 are coupled to each other and receive the buffering signal SBUF2. The output buffer 230 generates the output pulse signal CKOUT according to the inverted buffering signal SBUF2.

In this embodiment, in cooperation with the pull-up switch 240, the output buffer 230 disposed with a small number of inverters is applicable to a data latch with fewer bits to reduce power consumption.

On the other hand, in FIG. 2B, a pulse signal generator 202 includes the buffers 210 and 220, an output buffer 231 and the pull-up switch 240. Unlike the embodiment of FIG. 2A, the output buffer 231 included by the pulse signal generator 202 has a plurality of inverters respectively constructed by transistors MP4 and MN5 and transistors MP5 and MN6. Among them, the inverter composed of the transistors MP4 and MN5 is configured to invert the buffering signal SBUF2 to generate the output pulse signal CKOUT, and the inverter composed of the transistors MP5 and MN6 is configured to perform the inverting operation on the output pulse signal CKOUT so as to generate the inverted output pulse signal CKOUTB.

The pulse signal generator 202 in the embodiment of FIG. 2B can provide the inverted output pulse signal CKOUTB with a relatively high fan-out capability, and is applicable to a data latch with more bits. It is worth mentioning that, the fan-out capability of the pulse signal generator 202 may be achieved by increasing an aspect ratio of the transistors MP5 and MN6.

Figure 3A:
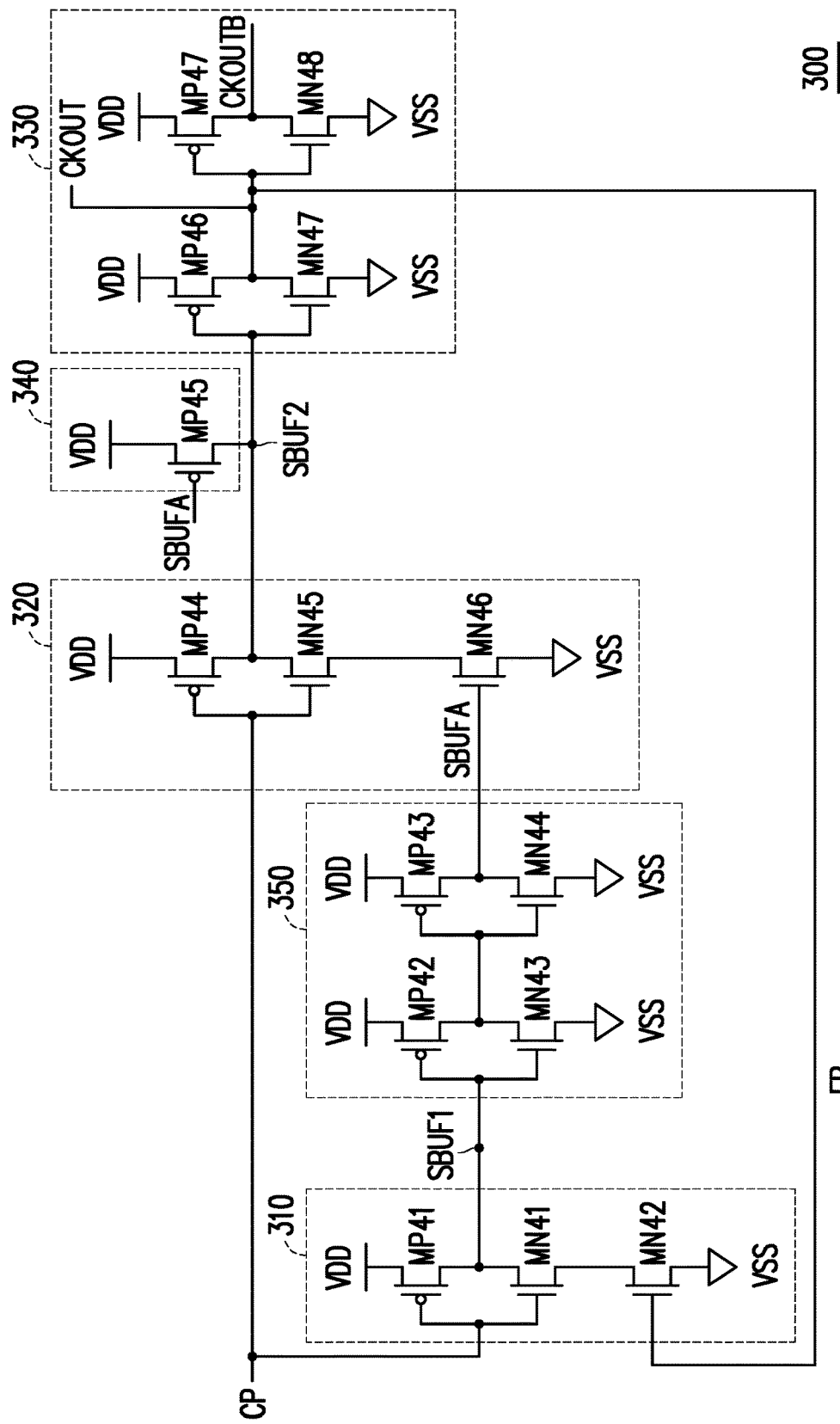
FIG. 3A is a schematic circuit diagram illustrating a pulse signal generator in another embodiment of the invention.

With reference to FIG. 3A, FIG. 3A is a schematic circuit diagram illustrating a pulse signal generator in another embodiment of the invention. A pulse signal generator 300 includes buffers 310 and 320, an output buffer 330, a pull-up switch 340 and a delay circuit 350 including a plurality of inverters composed of transistors MP42, MN43, MP43 and MN44. The buffer 310 includes transistors MP41, MN41 and MN42. The buffer 320 includes transistors MP44, MP45 and MN46. The output buffer 330 includes an inverter composed of transistors MP46 and MN47 and an inverter composed of transistors MP47 and MN48. With the setting of the output buffer 330, the pulse signal generator 300 can have the high fan-out capability, and ensure that the generated output pulse signal CKOUT and the inverted output pulse signal CKOUTB can have the characteristic of full swing.

It should be noted that, the delay circuit 350 including multiple inverters is additionally disposed in this embodiment of the invention. In this embodiment, the delay circuit 350 is coupled between an output end of the buffer 310 and a control end of the transistor MN46. The delay circuit 350 includes an inverter constructed by transistors MP42 and MN43 and an inverter constructed by transistors MP43 and MN44. The delay circuit 350 receives the buffering signal SBUF1, and generates a delayed buffering signal SBUFA according to the buffering signal SBUF1 after a transmission delay. It should be further noted that, the delayed buffering signal SBUFA is also transmitted to the pull-up switch 340 and configured to control a pull-up operation of the pull-up switch 340.

In this embodiment, the delay circuit 350 can delay a duration in which the buffer 320 stops driving the buffering signal SBUF2 and synchronously delay a time point at which the pull-up switch 340 activates the pull-up operation. In other words, through the transmission delay provided by the delay circuit 350, the pulse signal generator 300 may effectively control a pulse width of the output pulse signal CKOUT. In this embodiment, the transistors MP41 to MP47 are P-type transistors, and the transistors MN41 to MN48 are N-type transistors. With the setting of the transistor MN41, when a transitioning speed or a slew rate of the input signal CP is overly slow, a phenomenon of the buffering signal SBUF1 being changed to logic level 0 too early due to early transitioning of the feedback signal FB to logic high level may be prevented.

Further, in this embodiment, the delay circuit 350 is additionally disposed to further ensure that the output pulse signal CKOUT and the inverted output pulse signal CKOUTB have a long enough pulse width time for driving the latches of any types (static or dynamic) in the subsequent process.

Incidentally, in this embodiment of the invention, the delay circuit 350 may include two inverters. In other embodiments of the invention, the inverters disposed in the delay circuit 350 may have a different number of inverters to thereby adjust the pulse width of the output pulse signal CKOUT. The number of the inverters in the delay circuit 350 is not particularly limited as long as such number is an even number.

Figure 3B:
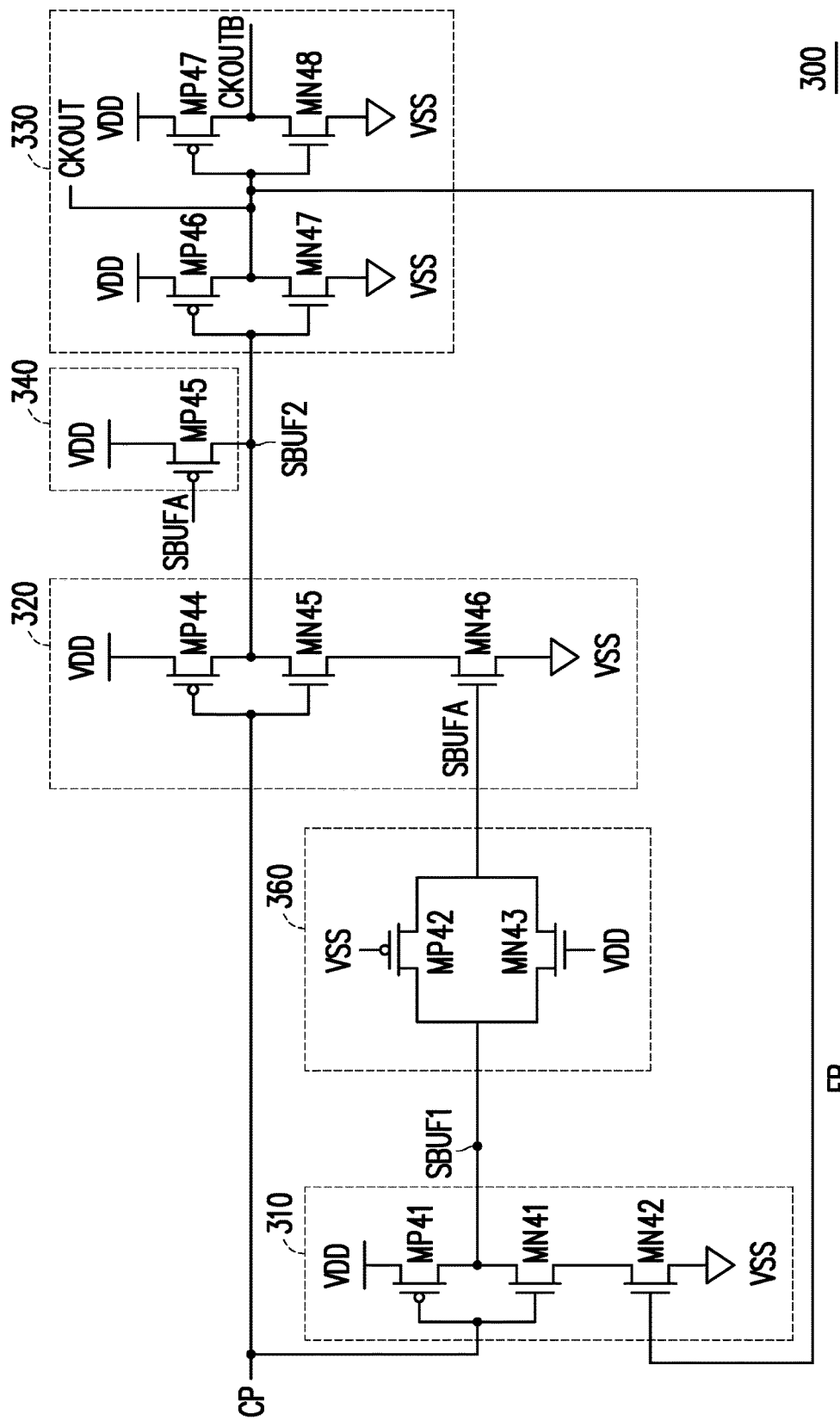
FIG. 3B illustrates a schematic circuit diagram illustrating a pulse signal generator in yet another embodiment of the invention.

With reference to FIG. 3B, FIG. 3B is a schematic circuit diagram illustrating a pulse signal generator in yet another embodiment of the invention. A pulse signal generator 300 includes the buffers 310 and 320, the output buffer 330, the pull-up switch 340 and a delay circuit 360. Unlike the foregoing embodiment, the delay circuit 360 is constructed by a transmission gate composed of the transistors MP42 and MN43 in this embodiment. A control end of the transistor MP42 receives the power voltage VDD, and a control end of the transistor MN43 is coupled to the reference ground end VSS.

In fact, the delay circuit in the embodiments of the invention does not have any particular implementation limitation. As well-known to persons with ordinary skill in the art, circuits capable of providing the transmission delay are all applicable in the implementation of the delay circuit.

Figure 4:
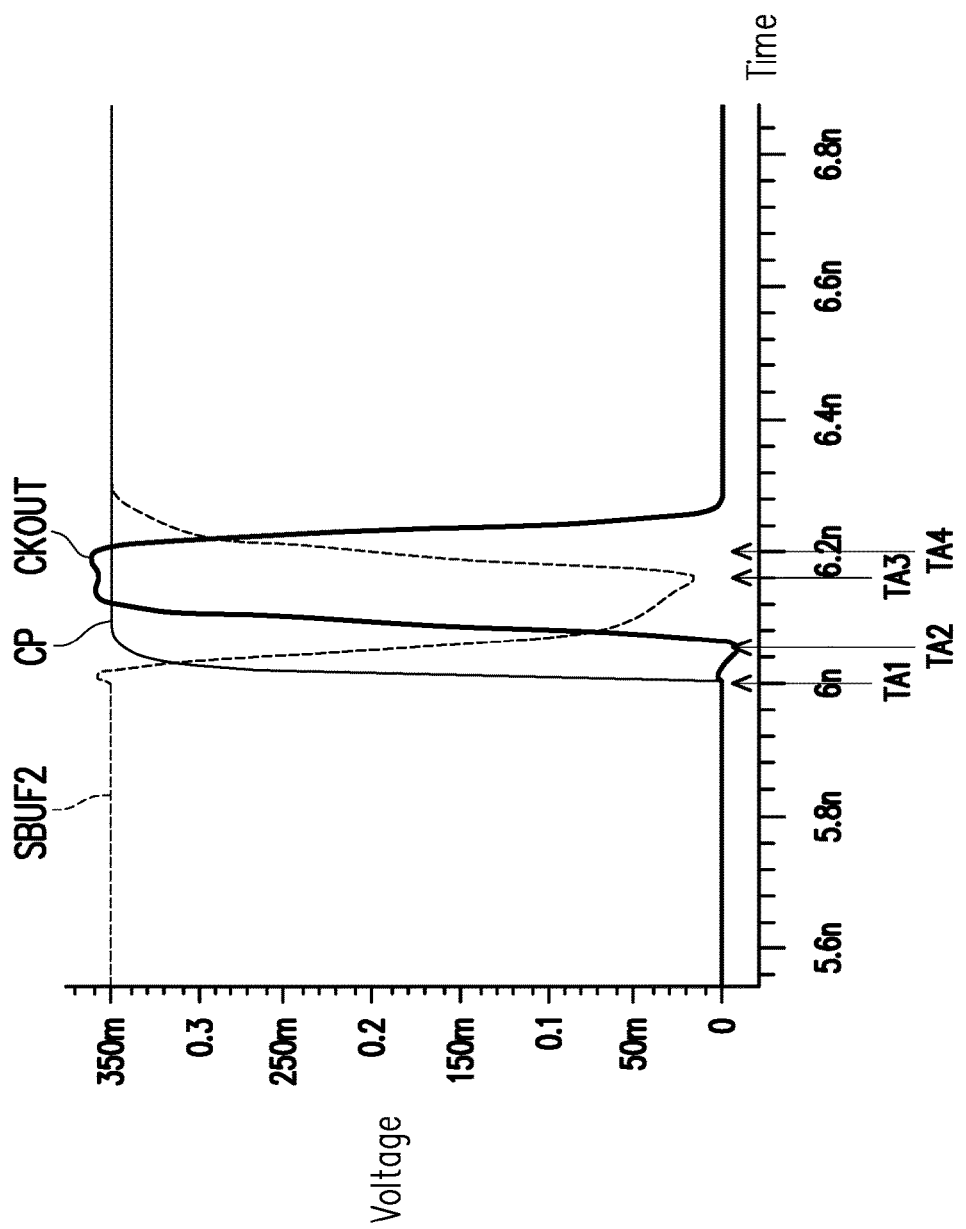
FIG. 4 is a waveform diagram illustrating operations of the pulse signal generator 202 in the embodiment of FIG. 3.

The following description refers to FIG. 3A and FIG. 4, FIG. 4 is a waveform diagram illustrating operations of the pulse signal generator 300 in the embodiment of FIG. 3A. Before a time point TA1, the input signal CP is at logic level 0. The buffers 310 and 320 correspondingly and respectively generate the buffering signals SBUF1 and SBUF2 equal to logic level 1. Based on the buffering signal SBUF1 equal to logic level 1, the pull-up switch 340 does not operate. The output buffer 331 generates the output pulse signal CKOUT equal to logic level 0 and the inverted output pulse signal CKOUTB equal to logic level 1.

At the time point TA1, the input signal CP starts transitioning (voltage rises). Meanwhile, based on the logic state of the feedback signal FB (equal to the output pulse signal CKOUT) not being changed yet (at logic level 0), the buffering signal SBUF2 generated by the buffer 320 starts transitioning (voltage drops).

At a time point TA2, based on a voltage value of the buffering signal SBUF2 dropping to a low enough voltage level, a voltage level of the output pulse signal CKOUT generated by the output buffer 331 starts rising. Then, at a time point TA3, the voltage value of the buffering signal SBUF2 drops to a lowest voltage level, and the voltage value of the output pulse signal CKOUT rises to a highest voltage level.

At the time point TA3, the feedback signal FB is at logic level 1 and the buffering signal SBUF1 generated by the buffer 310 is transitioned to logic level 0. At the time, the pull-up switch 340 activates the pull-up operation and makes the buffering signal SBUF2 transitioning to logic level 1. Correspondingly, at a time point TA4, the output pulse signal CKOUT starts transitioning to logic level 0. In correspondence to the transitioning phenomenon of the input signal CP, the pulse signal generator 300 can generate the output pulse signal CKOUT in high speed with the pulse width.

Here, it is worth mentioning that, the pulse width of the output pulse signal CKOUT may be set through the transmission delay provided by the delay circuit 350. The transmission delay provided by the delay circuit 350 may be achieved by adjusting a resistance of a transmission line in the delay circuit 350, adjusting a channel length of at least one of the transistors MP42, MP43, MN42 and MN43, adjusting threshold voltages of the transistors MP42, MP43, MN42 and MN43, or increasing the number of the inverters in the delay circuit 350.

Figure 5:
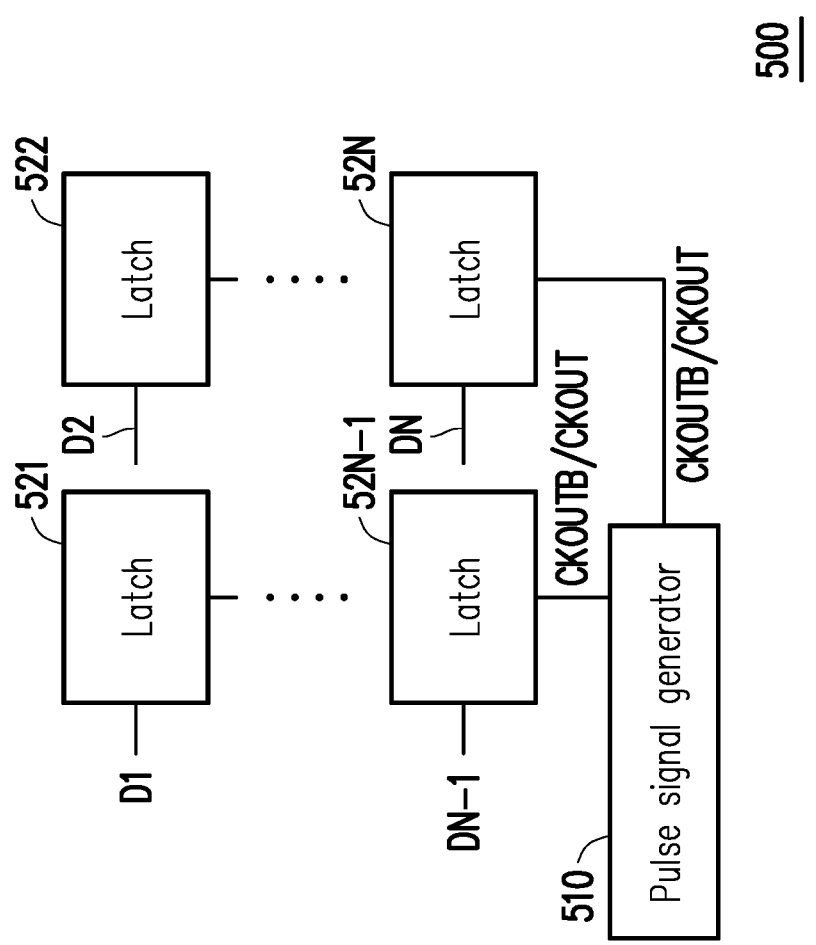
FIG. 5 is a schematic diagram illustrating a data latch circuit in an embodiment of the invention.

With reference to FIG. 5, FIG. 5 is a schematic diagram illustrating a data latch circuit in an embodiment of the invention. A data latch circuit 500 includes a pulse signal generator 510 and a plurality of dynamic latches 521 to 52N. The dynamic latches 521 to 52N respectively receive a plurality of data signals D1 to DN, and perform a latching operation on the data signals D1 to DN according to the output pulse signal CKOUT or the inverted output pulse signal CKOUTB. Here, each of the dynamic latches 521 to 52N may have the same circuit scheme, and applicable in the design without clock gating. In this embodiment of the invention, the output pulse signal CKOUT and/or the inverted output pulse signal CKOUTB with enough fan-out capability provided through one single pulse signal generator 510 can be used to perform the latching operation on the data signals of multi-bits. In this embodiment of the invention, the pulse signal generator 500 may be implemented by using any one of the pulse signal generators 100, 201, 202 and 300 in the foregoing embodiments.

The design scheme proposed by the embodiment of the invention can effectively reduce the complexity for winding the transmission wire in the circuit layout, effectively reduce the layout area, and effectively optimize power consumption in the circuit. Moreover, the design method of the embodiment of the present invention can also provide a friendly environment for the electronic design automation tool (EDA tool).

Figure 6:
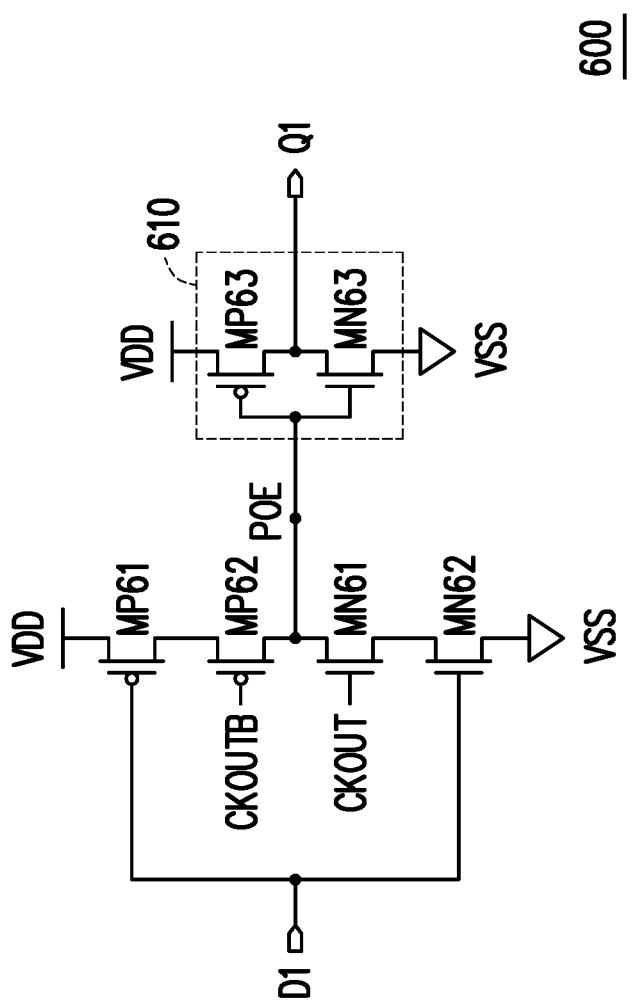
FIG. 6 to FIG. 10 are schematic diagrams illustrating various implementations of latches according to the embodiments of the invention.

Details regarding the implementation of the dynamic latches 521 to 52N may refer to the schematic diagram of FIG. 6, which illustrates an implementation of the latch according to an embodiment of the invention. In FIG. 6, a latch 600 is a dynamic latch. The latch 600 includes transistors MP61, MP62, MN61 and MN62 and an inverter 610. The transistors MP61 and MP62 are coupled in series between the power voltage VDD and a previous stage output end POE, and the transistors MN61 and MN62 are coupled in series between the previous stage output end POE and the reference ground end VSS. Control ends of the transistors MP61 and MP62 respectively receive the data signal D1 and the inverted output pulse signal CKOUTB, and control ends of the transistors MN61 and MN62 respectively receive the output pulse signal CKOUT and the data signal D1.

It is worth mentioning that, a coupling order of the transistors MP61 and MP62 is not limited by what illustrated in FIG. 6, and a coupling order of the transistors MN61 and MN62 is not limited by what illustrated in FIG. 6 either. The coupling orders may be changed based on designer's demand.

In this embodiment, an input end of the inverter 610 is coupled to the previous stage output end POE, and an output end of the inverter 610 generates an output signal Q1. The buffer 610 includes transistors MP63 and MN63. The transistors MP63 and MN63 are coupled in series between the power voltage VDD and the reference ground end VSS, and control ends of the transistors MP63 and MN63 are coupled to each other and coupled to the previous stage output end POE.

Figure 7:
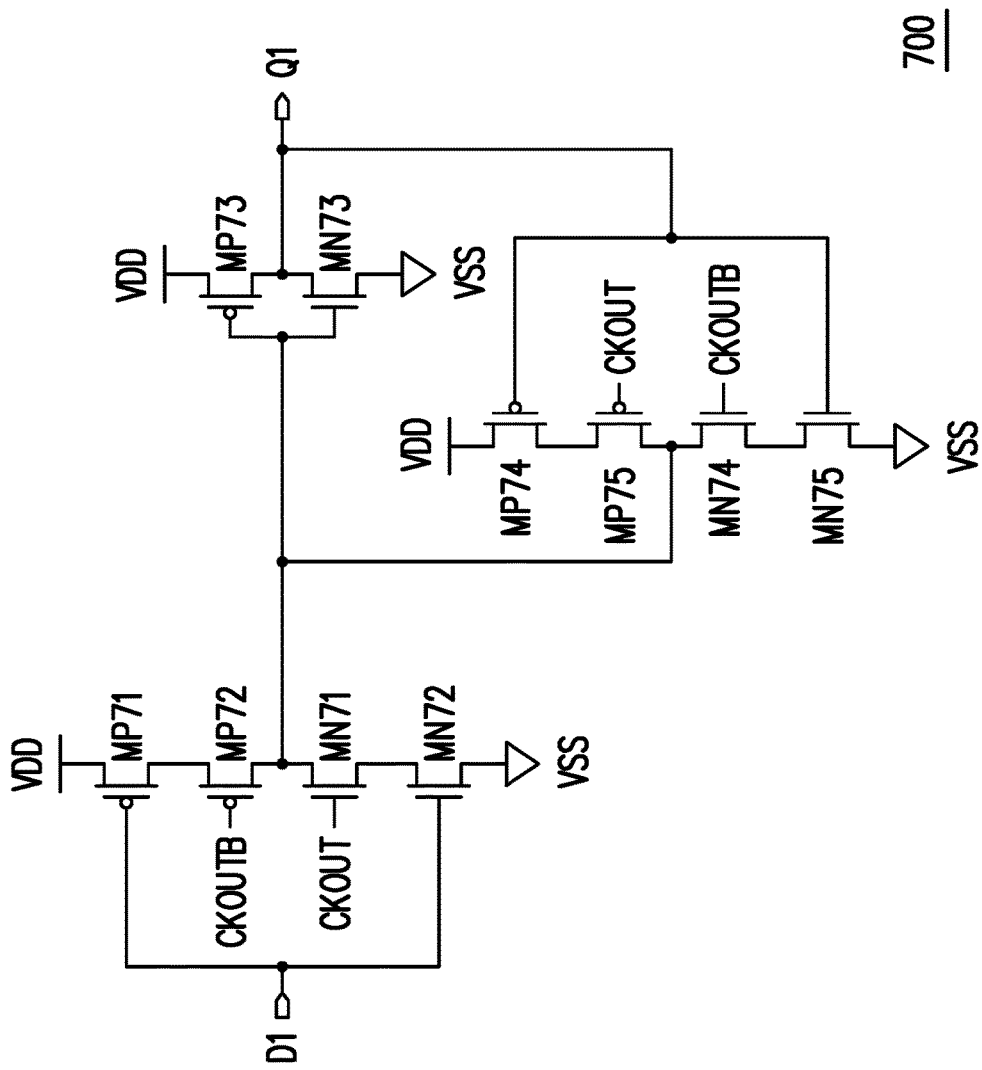

With reference to FIG. 7, FIG. 7 is a schematic diagram illustrating another implementation of the latch according to another embodiment of the invention. A latch 700 is a static latch. The latch 700 receives the output pulse signal CKOUT and the inverted output pulse signal CKOUTB generated by the pulse signal generator 510. The latch 700 includes transistors MP71 to MP75 and transistors MN71 to MN75. The transistors MP71, MP72, MN71 and MN72 are sequentially coupled in series between the power voltage VDD and the reference ground end VSS. Control ends of the transistors MP71 and MN72 receive the data signal D1, and control ends of the transistors MP72 and MN71 respectively receive the inverted output pulse signal CKOUTB and the output pulse signal CKOUT. A node where the transistors MP72 and MN71 are coupled to each other is coupled to control ends of the transistors MP73 and MN73. The transistors MP73 and MN73 form an inverter with an output end generating the output signal Q1. In addition, the transistors MP74, MP75, MN74 and MN75 are sequentially coupled in series between the power voltage VDD and the reference ground end VSS. Control ends of the transistors MP74 and MN75 receive the output signal Q1. A node where the transistors MP75 and MN74 are coupled to each other is coupled to control ends of the transistors MP73 and MN73. Control ends of the transistors MP75 and MN74 respectively receive the output pulse signal CKOUT and the inverted output pulse signal CKOUTB.

Figure 8:
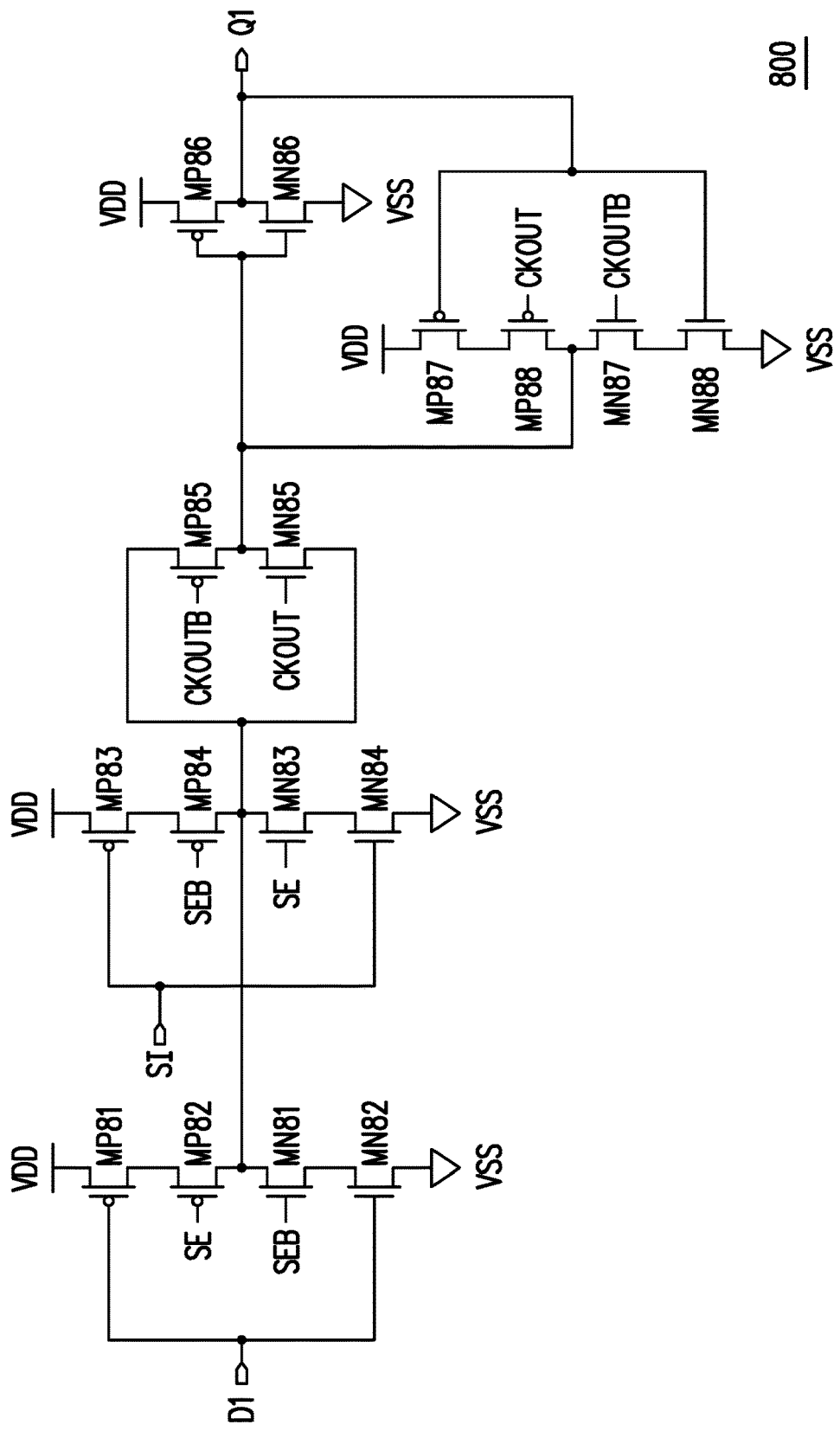

With reference to FIG. 8, FIG. 8 is a schematic diagram illustrating another implementation of the latch according to another embodiment of the invention. A latch 800 is a scan D latch. The latch 800 receives the output pulse signal CKOUT and the inverted output pulse signal CKOUTB generated by the pulse signal generator 510. The latch 800 includes transistors MP81 to MP86 and transistors MN81 to MN88. Among them, the transistors MP81, MP82, MN81 and MN82 are sequentially coupled in series between the power voltage VDD and the reference ground end VSS. Control ends of the transistors MP81 and MN82 receive the data signal D1, and control ends of the transistors MP82 and MN81 respectively receive a scan enabling signal SE and an inverted scan enabling signal SEB. The transistors MP83, MP84, MN83 and MN84 are sequentially coupled in series between the power voltage VDD and the reference ground end VSS. Control ends of the transistors MP83 and MN84 receive a scan input signal S1, and control ends of the transistors MP84 and MN83 respectively receive the inverted scan enabling signal SEB and the scan enabling signal SE. A node where the transistor MP82 and the transistor MN81 are coupled to each other is coupled to a node where the transistor MP84 and the transistor MN83 are coupled to each other.

The transistors MP85 and MN85 form a transmission gate, which has one end coupled to a node where the transistor MP82, the transistor MN81, the transistor MP84 and the transistor MN83 are coupled to each other and another end coupled to control ends of the transistors MP86 and MN86. Control ends of the transistors MN85 and MP85 respectively receive the output pulse signal CKOUT and the inverted output pulse signal CKOUTB.

The transistors MP86 and MN86 form an inverter with an output end generating the output signal Q1 and being coupled to control ends of the transistors MP87 and MN88. The transistors MP87, MP88, MN87 and MN88 are sequentially coupled between the power voltage VDD and the reference ground end VSS. Control ends of the transistors MP88 and MN87 respectively receive the output pulse signal CKOUT and the inverted output pulse signal CKOUTB. A node where the transistors MP88 and MN87 are coupled to each other is coupled to the control ends of the transistors MP86 and MN86.

Figure 9A:
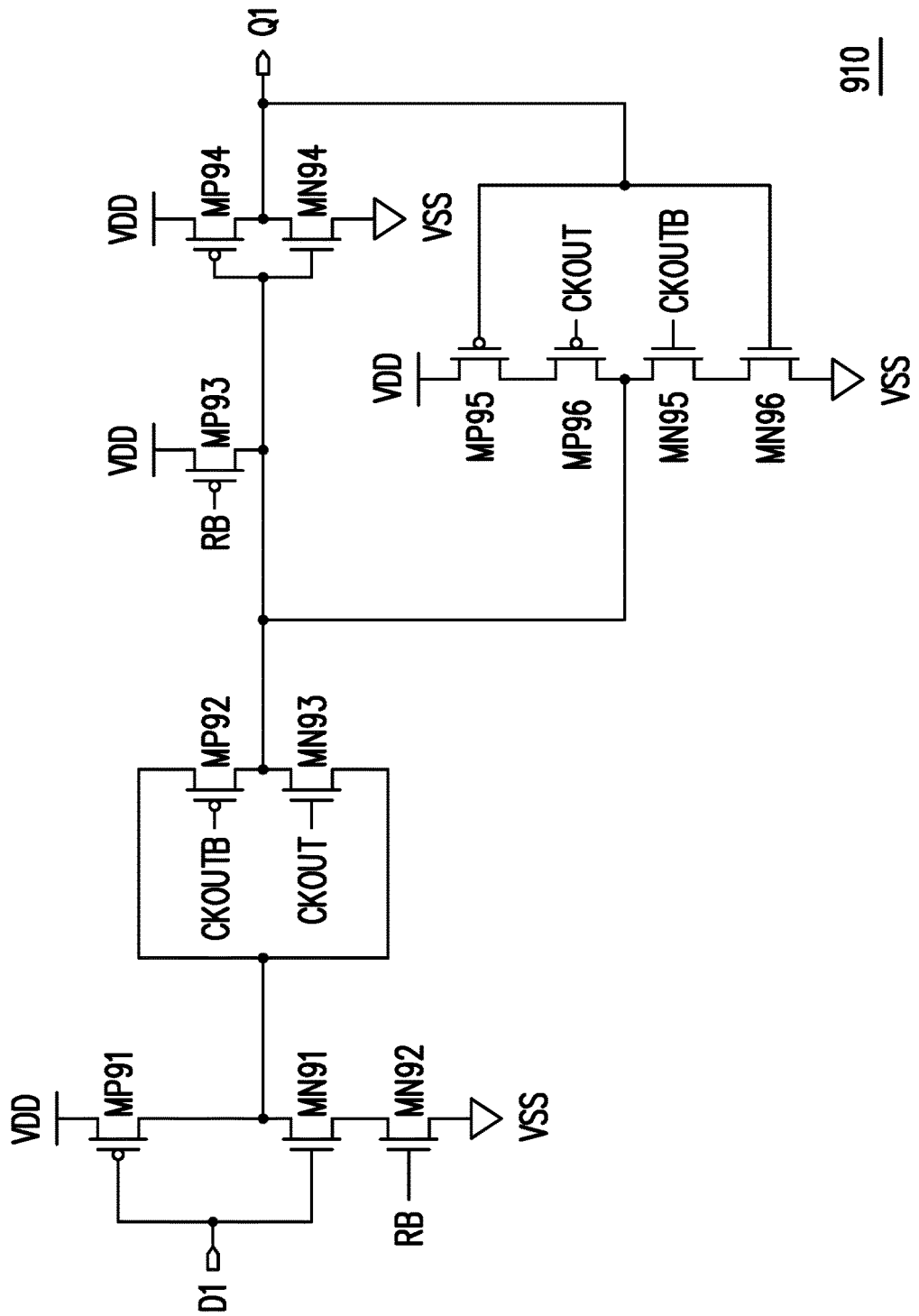

With reference to FIG. 9A, FIG. 9A is a schematic diagram illustrating another implementation of the latch according to another embodiment of the invention. A latch 910 is a scan D latch with reset function. The latch 910 receives the output pulse signal CKOUT and the inverted output pulse signal CKOUTB generated by the pulse signal generator 510. The latch 910 includes transistors MP91 to MP96 and transistors MN91 to MN96. Among them, the transistors MP91, MN91 and MN92 are sequentially coupled in series between the power voltage VDD and the reference ground end VSS. Control ends of the transistors MP91 and MN91 receive the output signal Q1. A control end of the transistor MN92 receives a reset signal RB. The transistors MP92 and MP93 form a transmission gate. One end of the transmission gate is coupled to a node where the transistors MP91 and MN91 are coupled to each other, and another end of the transmission gate is coupled to control ends of the transistors MP94 and MN94. In addition, the transistor MP93 form a pull-up switch, which is coupled between the power voltage VDD and the control ends of the transistors MP94 and MN94. A control end of the transistor MP93 receives the reset signal RB, and pulls up voltage values on the control ends of the transistors MP94 and MN94 when the reset signal RB is logic level 0. The transistors MP94 and MN94 are configured to form an inverter, and the inverter can correspondingly generate the output signal Q1 with logic level 0 when the voltage values on the control ends of the transistors MP94 and MN94 are pulled up.

On the other hand, the transistors MP95, MP96, MN95 and MN96 are sequentially coupled in series between the power voltage VDD and the reference ground end VSS. Control ends of the transistors MP95 and MN96 receive the output signal Q1, and control ends of the transistors MP96 and MN95 respectively receive the output pulse signal CKOUT and the inverted output pulse signal CKOUTB. A node where the transistors MP96 and MN95 are coupled to each other is coupled to control ends of the transistors MP94 and MN94.

Figure 9B:
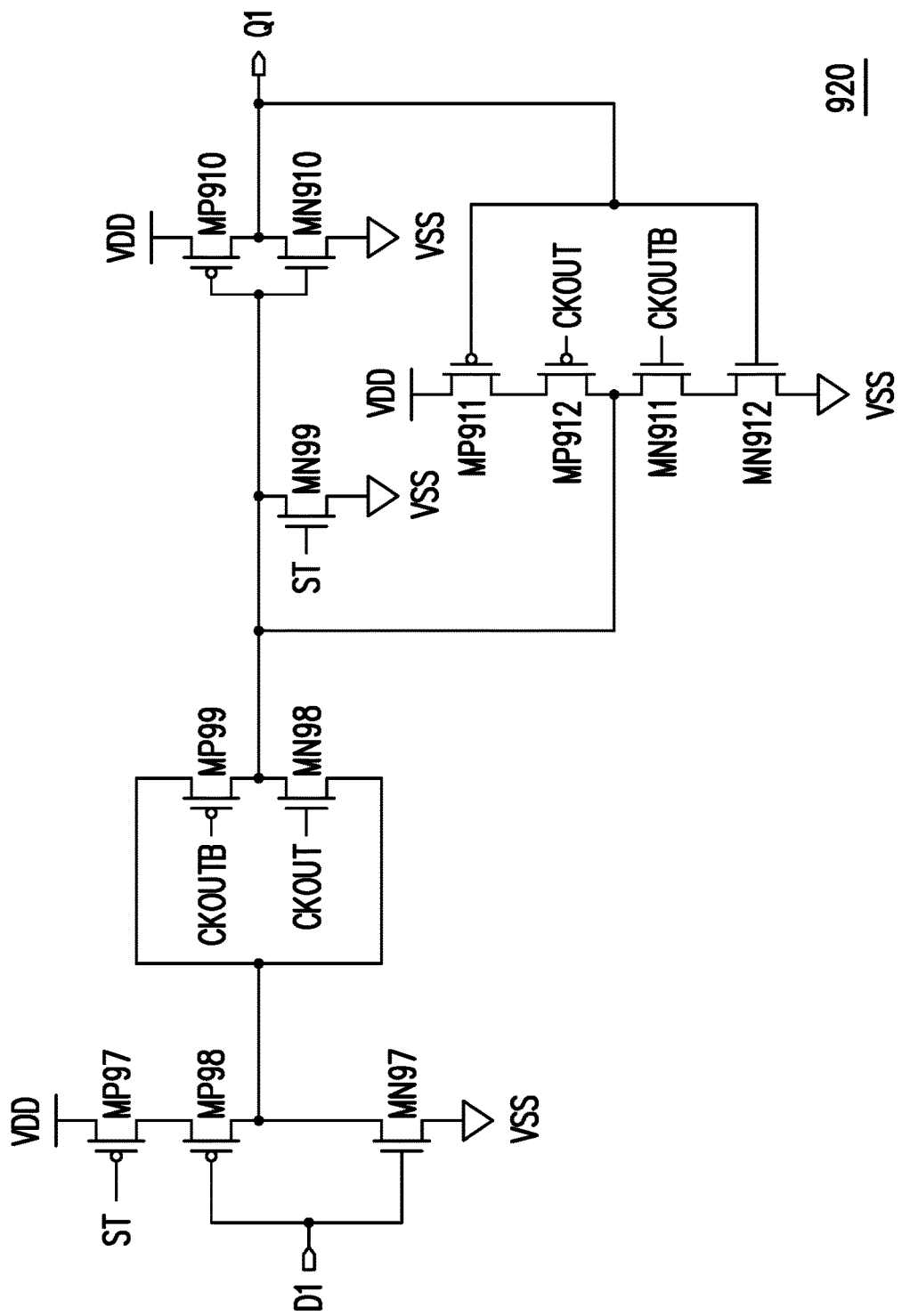

With reference to FIG. 9B, FIG. 9B is a schematic diagram illustrating another implementation of the latch according to another embodiment of the invention. A latch 920 is a scan D latch with setup function. The latch 920 receives the output pulse signal CKOUT and the inverted output pulse signal CKOUTB generated by the pulse signal generator 510. The latch 920 includes transistors MP97 to MP912 and transistors MN97 to MN912. Among them, the transistors MP97, MP98 and MN97 are sequentially coupled in series between the power voltage VDD and the reference ground end VSS. Control ends of the transistors MP98 and MN97 receive the output signal Q1. A control end of the transistor MP97 receives a setup signal ST. The transistors MP99 and MN98 form a transmission gate. One end of the transmission gate is coupled to a node where the transistors MP98 and MN97 are coupled to each other, and another end of the transmission gate is coupled to control ends of the transistors MP910 and MN910. In addition, the transistor MP99 form a pull-down switch, which is coupled between the reference ground end VSS and the control ends of the transistors MP910 and MN910. A control end of the transistor MN99 receives the setup signal ST, and pulls down voltage values on the control ends of the transistors MP910 and MN910 when the setup signal ST is logic level 1. The transistors MP910 and MN910 are configured to form an inverter, and the inverter can correspondingly generate the output signal Q1 with logic level 1 when the voltage values on the control ends of the transistors MP910 and MN910 are pulled down.

On the other hand, the transistors MP911, MP912, MN911 and MN912 are sequentially coupled in series between the power voltage VDD and the reference ground end VSS. Control ends of the transistors MP911 and MN912 receive the output signal Q1, and control ends of the transistors MP912 and MN911 respectively receive the output pulse signal CKOUT and the inverted output pulse signal CKOUTB. A node where the transistors MP912 and MN911 are coupled to each other is coupled to control ends of the transistors MP910 and MN910.

Figure 10:
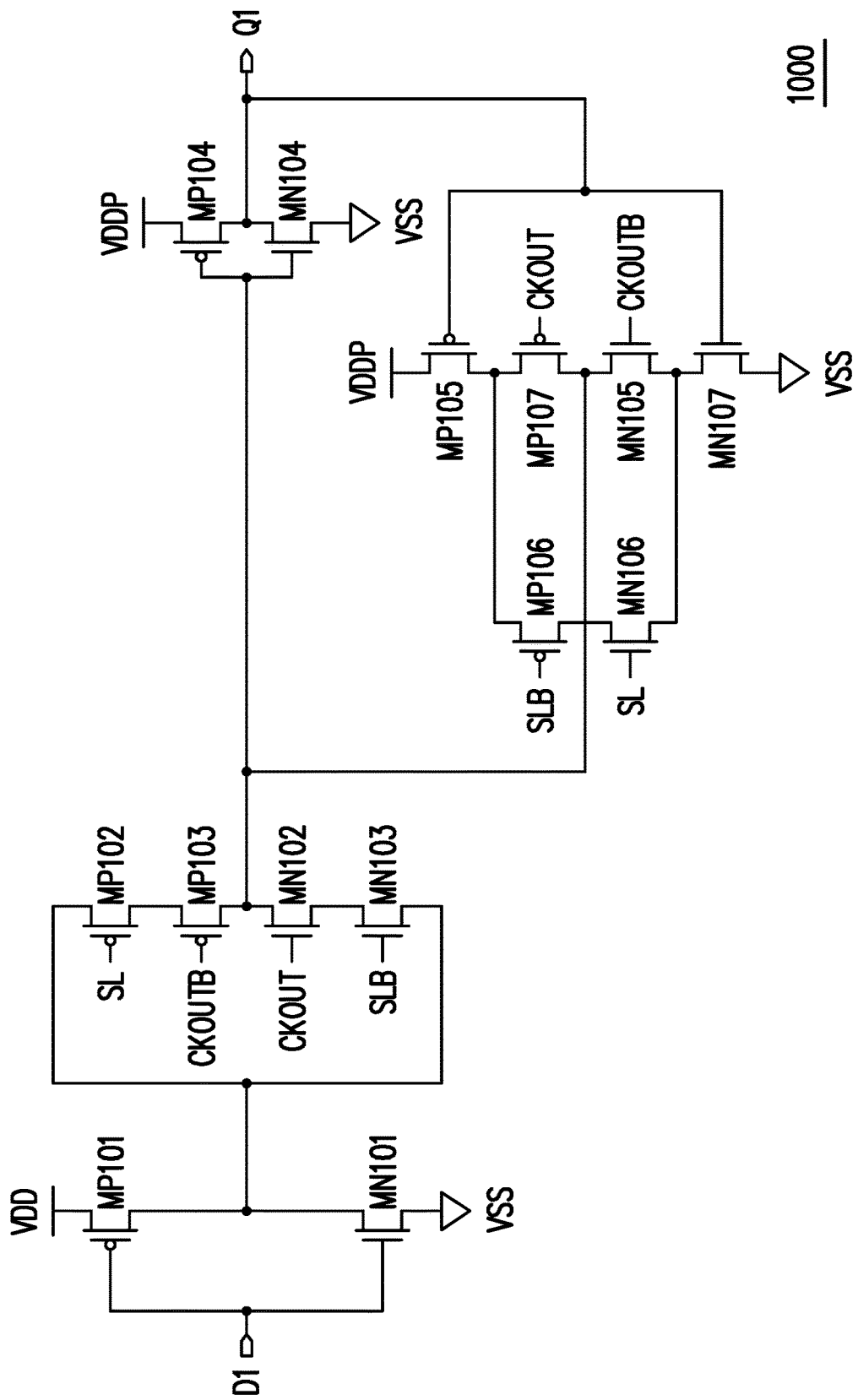

With reference to FIG. 10, FIG. 10 is a schematic diagram illustrating another implementation of the latch according to another embodiment of the invention. A latch 1000 is a retention D latch. The latch 1000 receives the output pulse signal CKOUT and the inverted output pulse signal CKOUTB generated by the pulse signal generator 510. The latch 1000 includes transistors MP101 to MP107 and transistors MN101 to MN107. The transistors MP101 and MN101 form an inverter with an input end receiving the data signal D1 and an output end coupled to a transmission gate composed of the transistors MP102, MP103, MN102 and MN103.

Control ends of the transistors MP102, MP103, MN102 and MN103 respectively receive a sleep signal SL, the inverted output pulse signal CKOUTB, the output pulse signal CKOUT and an inverted sleep signal SLB. A node where the transistors MP103 and MN102 are coupled to each other is coupled to control ends of the transistors MP104 and MN104. The transistors MP104 and MN104 form an inverter, which receives a power voltage VDDP to be an operating voltage. Here, the power voltage VDDP is an always-on voltage. The inverter formed by the transistors MP104 and MN104 is configured to generate the output signal Q1, and transmit the output signal Q1 to control ends of the transistors MP105 and MN107. The transistors MP105, MP107, MN105 and MN107 are sequentially coupled in series between the power voltage VDDP and the reference ground end VSS. Here, the transistors MP106 and MN106 are coupled in parallel with the transistors MP107 and MN105 respectively. Control ends of the transistors MP106 and MN106 respectively receive the inverted sleep signal SLB and the sleep signal SL. A node where the transistors MP106 and MN106 are coupled to each other is coupled to control ends of the transistors MP104 and MN104.

It should be noted that, in the foregoing embodiments of FIG. 7 to FIG. 10, the different latch circuits implemented together with the pulse wave signal generator can substantially reduce the number of transistors required in the circuit, and effectively reduce required circuit area and manufacturing cost. Also, required power consumption during operation may be effectively reduced to meet the requirements of energy saving and carbon reduction.

In summary, the invention provides a pulse signal generator that can operate in high speed and reduce required power consumption. Here, the pulse width of the output pulse signal may be controlled by controlling an operating time of the pull-up switch. Accordingly, the pulse with enough width and full swing may be effectively generated for effectively performing the subsequent data latching operation. In the embodiments of the invention, the data latch circuit composed of the dynamic latch can further reduce circuit area and power consumption. In this way, not only can the cost be reduced, the effect of saving energy and reducing carbon may also be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pulse signal generator, comprising:
   a first buffer, receiving an input signal and a feedback signal, and generating a first buffering signal according to the input signal and the feedback signal;
   a second buffer, receiving the input signal and the first buffering signal, and generating a second buffering signal according to the input signal and the first buffering signal;
   a pull-up switch, coupled to an output end of the second buffer, receiving the first buffering signal, and pulling up the second buffering signal according to the first buffering signal; and
   an output buffer, coupled to the first buffer and the second buffer, generating at least one output pulse signal according to the second buffering signal, the output buffer transmitting the at least one output pulse signal to the first buffer to be the feedback signal.

2. The pulse signal generator of claim 1, wherein the first buffer comprises:
   a first transistor, having a first end coupled to a power voltage, a second end of the first transistor generating the first buffering signal, and a control end of the first transistor receiving the input signal;
   a second transistor, having a first end coupled to the second end of the first transistor, and a control end of the second transistor receiving the input signal; and
   a third transistor, having a first end coupled to a second end of the second transistor, a control end of the third transistor receiving the feedback signal, and a second end of the third transistor coupled to a reference ground end.

3. The pulse signal generator of claim 1, wherein the second buffer comprises:
   a first transistor, having a first end coupled to a power voltage, a second end of the first transistor generating the second buffering signal, and a control end of the first transistor receiving the input signal;
   a second transistor, having a first end coupled to the second end of the first transistor, and a control end of the second transistor receiving the input signal; and
   a third transistor, having a first end coupled to a second end of the second transistor, a control end of the third transistor receiving the first buffering signal, and a second end of the third transistor coupled to a reference ground end.

4. The pulse signal generator of claim 1, wherein the output buffer comprises:
   a first inverter, receiving the second buffering signal, and generating a first output pulse signal according to the second buffering signal.

5. The pulse signal generator of claim 4, wherein the output buffer further comprises:
   a second inverter, receiving the first output pulse signal, and generating a second output pulse signal according to the first output pulse signal, wherein the second output pulse signal is an inverted signal of the first output pulse signal.

6. The pulse signal generator of claim 1, further comprising:
a delay circuit, the delay circuit comprising a plurality of inverters, the inverters being coupled in series on a path of the second buffer for receiving the first buffering signal and configured to provide a transmission delay for receiving the first buffering signal to the second buffer.

7. The pulse signal generator of claim 6, wherein a number of the inverters is an even number.

8. The pulse signal generator of claim 1, further comprising:
a delay circuit, the delay circuit comprising a transmission gate, the transmission gate being coupled in series on a path of the second buffer for receiving the first buffering signal and configured to provide a transmission delay for receiving the first buffering signal to the second buffer.

9. A data latch circuit, comprising:
a plurality of latches, respectively receiving a plurality of data signals, and latching the data signals according to at least one output pulse signal; and
the pulse signal generator of claim 1, coupled to the latches, and configured to provide the at least one output pulse signal.

10. The data latch circuit of claim 9, wherein each of the latches is a dynamic latch, and the dynamic latch comprises:
a first transistor, coupled between a power voltage and a previous stage output end, a control end of the first transistor receiving each of the data signals;
a second transistor, coupled between the power voltage and the previous stage output end, a control end of the second transistor receiving an inverted signal of the at least one output pulse signal;
a third transistor, coupled between a reference ground end and the previous stage output end, a control end of the third transistor receiving each of the data signals;
a fourth transistor, coupled between the reference ground end and the previous stage output end, a control end of the fourth transistor receiving the at least one output pulse signal; and
an inverter, coupled to the previous stage output end, and inverting a logic level on the previous stage output end to generate an output signal.

11. The data latch circuit of claim 10, wherein the inverter comprises:
a fifth transistor, having a first end receiving the power voltage, a second end of the fifth transistor generating the output signal, and a control end of the fifth transistor coupled to the previous stage output end; and
a sixth transistor, having a first end coupled to the second end of the fifth transistor, a second end of the sixth transistor coupled to the reference ground end, and a control end of the sixth transistor coupled to the previous stage output end.

12. The data latch circuit of claim 9, wherein each of the latches is a static latch, a scan D latch, a D latch with reset function, a D latch with setup function or a retention D latch.

* * * * *